United States Patent [19]

Nakamura et al.

[11] Patent Number: 4,684,992
[45] Date of Patent: Aug. 4, 1987

[54] SOLID STATE IMAGE SENSOR HAVING MEANS TO RESET AND CLEAR STATIC INDUCTION TRANSISTOR PHOTOELEMENTS

[75] Inventors: Tsutomu Nakamura; Kazuya Matsumoto, both of Ina, Japan

[73] Assignee: Olympus Optical Co., Ltd., Japan

[21] Appl. No.: 799,136

[22] Filed: Nov. 18, 1985

[30] Foreign Application Priority Data

Nov. 21, 1984 [JP] Japan ................. 59-244637

[51] Int. Cl.⁴ .................................... H04N 3/14
[52] U.S. Cl. ......................... 358/213.12; 358/213.19; 357/22
[58] Field of Search ................. 358/212, 213; 357/24 LR, 30, 22 B, 22 C; 250/578

[56] References Cited

U.S. PATENT DOCUMENTS

| | | | |
|---|---|---|---|
| 4,333,224 | 6/1982 | Buchanan | 29/571 |
| 4,377,817 | 3/1983 | Nishizawa et al. | 357/22 |
| 4,381,517 | 4/1983 | Harada | 357/30 |
| 4,421,358 | 12/1983 | Wade | 357/30 |
| 4,485,392 | 11/1984 | Singer | 357/22 |
| 4,524,391 | 6/1985 | Nishizawa et al. | 358/213 |
| 4,525,742 | 6/1985 | Nishizawa et al. | 358/213 |
| 4,531,156 | 7/1985 | Nishizawa et al. | 358/213 |
| 4,556,909 | 12/1985 | Yamada | 358/212 |
| 4,562,474 | 12/1985 | Nishizawa | 358/213 |
| 4,573,077 | 2/1986 | Imai | 358/213 |
| 4,589,027 | 5/1986 | Nakamura et al. | 358/213 |

FOREIGN PATENT DOCUMENTS 53-72471  6/1978  Japan.
55-166965 12/1980 Japan.
59-188278 10/1984 Japan.

OTHER PUBLICATIONS

*Integrated Circuit Engineering*, Glaser et al., Addison-Wesley Pub. Co., Reading, Mass., May 1979, FIG. 3.4, p. 80.

Primary Examiner—Gene Z. Rubinson
Assistant Examiner—Stephen Brinich
Attorney, Agent, or Firm—Parkhurst & Oliff

[57] ABSTRACT

A solid state image sensor including a number of lateral type static induction transistors arranged in a matrix, sources of all transistors being commonly connected to ground potential, gates of transistors arranged in each row being commonly connected to respective row lines and drains of transistors arranged in each column commonly connected to respective column lines, a vertical scanning circuit connected to the row lines, a plurality of column selection transistors each connected between respective column lines and a video output line, and a horizontal scanning circuit connected to gates of the column selection transistors. After one row has been read out, photocarriers stored in transistors belonging to the relevant row are simultaneously discharged by means of a reset signal supplied from the vertical scanning circuit. Then any excessive amounts of photocarriers stored in the transistors are discharged away by means of clear signals supplied from the vertical scanning circuit every time transistors belonging to another row are reset.

5 Claims, 27 Drawing Figures

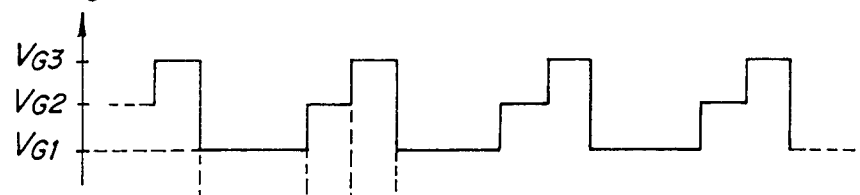
FIG.2A $V_G$
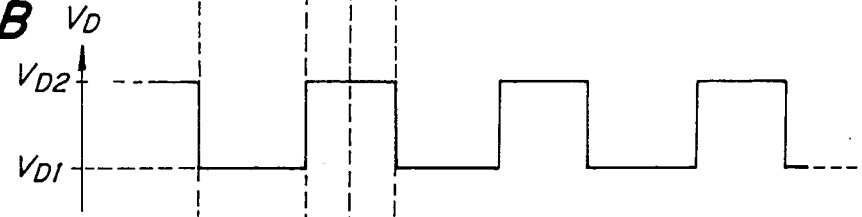
FIG.2B $V_D$
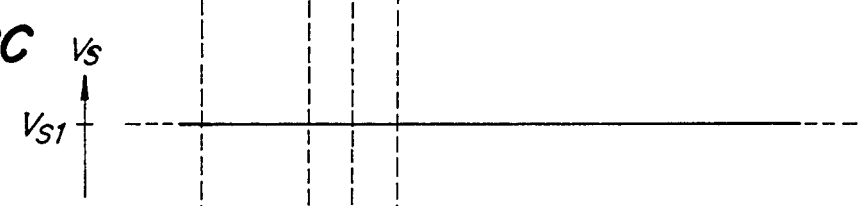
FIG.2C $V_S$
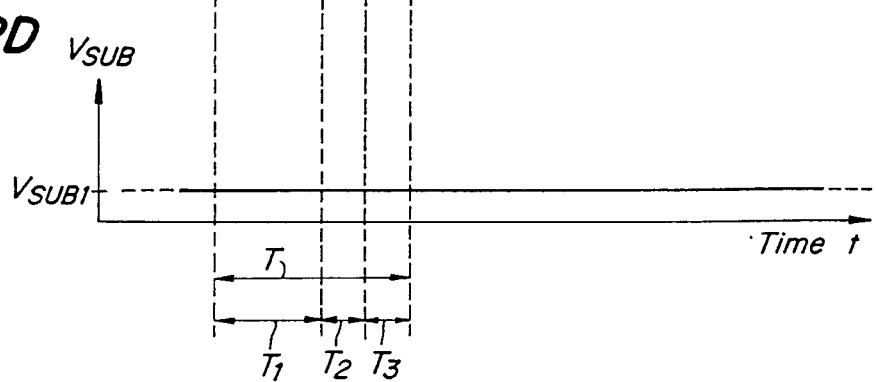
FIG.2D $V_{SUB}$

FIG_6

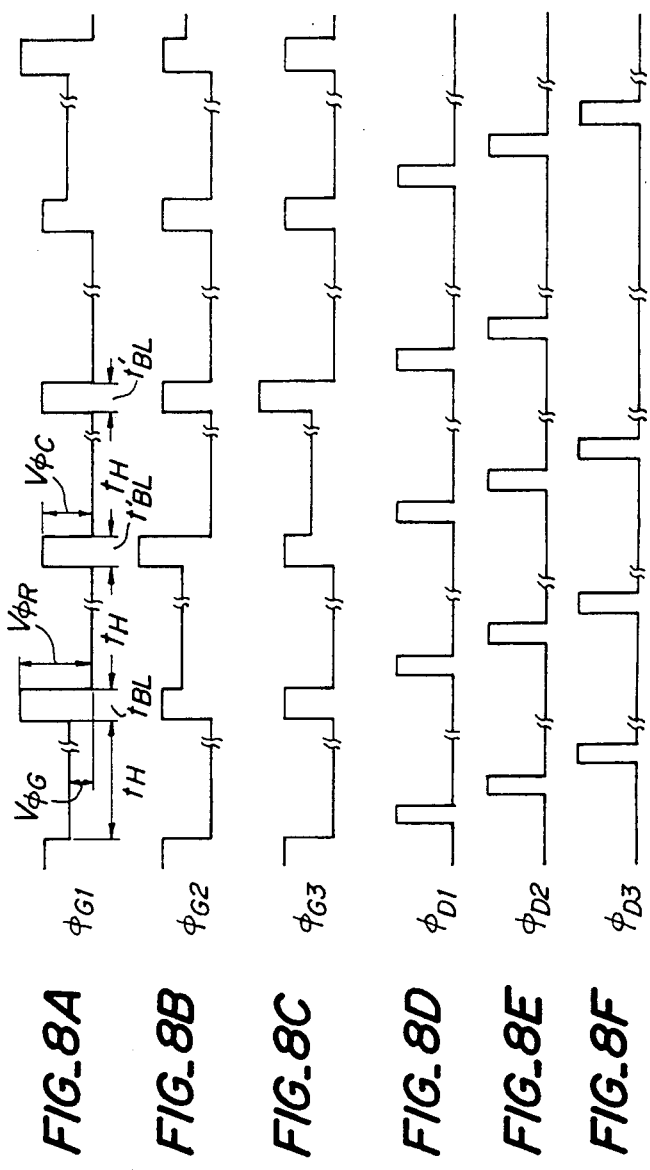

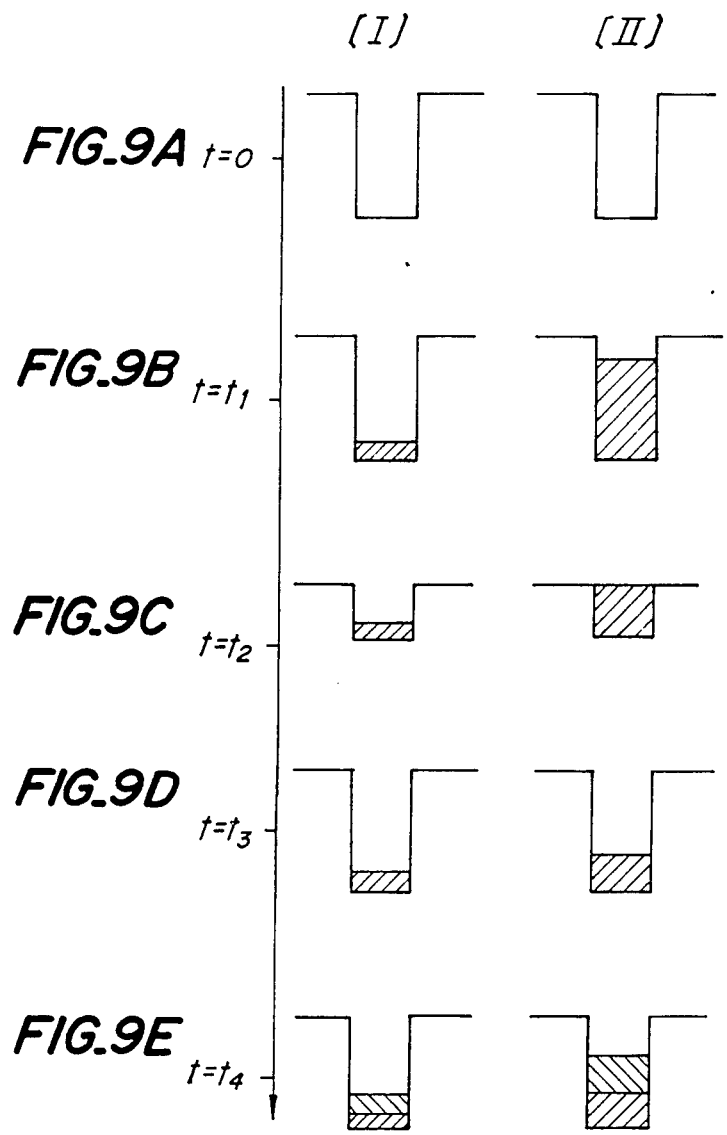

SOLID STATE IMAGE SENSOR HAVING MEANS TO RESET AND CLEAR STATIC INDUCTION TRANSISTOR PHOTOELEMENTS

BACKGROUND OF THE INVENTION

1. Field of the Invention

The present invention relates to a solid state image sensor comprising a number of pixels each of which is formed by a lateral type static induction transistor in which a source-drain current passes in parallel with a surface of a semiconductor substrate.

2. Related Art Statement

The solid state image sensor of the kind mentioned above has been proposed in U.S. patent applications Ser. Nos. 556,347 and 715,641. FIG. 1A is an equivalent circuit of the lateral type static induction transistor (LSIT), the structure of which is shown in FIG. 1B, developed by the applicant to which the present application has been asigned. This LSIT is of n-channel type and constitutes a common source configuration. A source terminal 1 is connected to a source electrode (S) and a source voltage $V_S$ is applied thereto. A drain terminal 2 is coupled with a drain electrode (D) via a load resistor ($R_L$)4 and the drain electrode is connected to an output terminal 5 deriving an output voltage $V_{OUT}$. A drain voltage $V_D$ is applied to the drain terminal 2. A gate terminal 3 is connected to a gate electrode (G)6 and a gate voltage $V_G$ is applied thereto. Incident light 7 is made incident upon the gate electrode 6. Further a substrate voltage $V_{SUB}$ is applied to a substrate terminal 8.

In FIG. 1B, 21 is an n type silicon substrate, 22 is an n⁻ type epitaxial layer formed on the substrate 21, 23 is an n⁺ source region diffused in the surface of the epitaxial layer 22 and 24 is an n⁺ drain region which is also diffused in the surface of the epitaxial layer 22, the n⁻ epitaxial layer 22 forming a channel region. Further, 25 is a buried gate region which is formed on the substrate 21 (and beneath the channel region 22) as a p⁺ buried layer and 26 is a p⁺ type surface gate region diffused in the surface of the channel region 22 between the source and drain regions. Both gate regions 25 and 26 store the signal charges generated in the channel region 22 in response to the optical input and are interconnected by means of a p⁺ diffused region 27 to form signal charge storage regions which control the potential barrier in the channel between the source and the drain from both sides by the static induction effect of the gate voltage thereon. On the p⁺ regions 26 and 28 there is provided an insulating film 29 such as SiO₂ etc., on which film is provided an electrode 30 to form an MIS type gate electrode. Finally, 31 is an isolation region for isolating the lateral SITs from each other, each SIT comprising a source region 23, a drain region 24 and signal charge storage regions 25, 26, 27 and 28.

FIGS. 2A to 2D are signal waveforms for explaining the operation of LSIT shown in FIGS. 1A and 1B. FIG. 2A illustrates the gate voltage $V_G$ applied to the gate terminal 3, FIG. 2B the drain voltage $V_D$ applied to the drain terminal 2, FIG. 2C the source voltage $V_S$ applied to the source terminal 1 and FIG. 2D depicts the substrate voltage $V_{SUB}$ applied to the substrate terminal 8. One operational period is assumed to be T which is consisting of store period $T_1$, readout period $T_2$ and reset period $T_3$. During the whole operation period T, the source voltage $V_S$ is maintained at the ground voltage $V_{S1}$ ($V_{S1}=0$) and the substrate voltage $V_{SUB}$ is remained at the reverse bias voltage $V_{SUB1}$ ($V_{SUB1}<0$). During the store period $T_1$, the gate voltage $V_G$ is set to a deep reverse bias voltage $V_{G1}$ ($V_{G1}<0$) and holes induced at an interface between the semiconductor portion immediately below the gate and a gate insulating film in accordance with the incident light 7 are stored. It should be noted that during the store period $T_1$, the drain voltage $V_D$ is set to the ground voltage $V_{D1}$. Next, in the readout period $T_2$ the gate voltage $V_G$ is changed to a gate readout voltage $V_{G2}$ ($V_{G1} \leq V_{G2}<0$), and the drain voltage $V_D$ is changed to a readout voltage $V_{D2}$ ($V_{D2}>0$). In this manner, an output signal proportional to an amount of the incident light is readout. Then, in the reset period $T_3$, the gate voltage $V_G$ is changed to a forward bias voltage $V_{G3}$ ($V_{G3}>0$), and the holes stored under the gate are flowed away. It should be noted that during the reset period $T_3$, the drain voltage $V_D$ may be set to the readout voltage $V_{D2}$ as shown in FIG. 2B or may be set to the ground voltage $V_{D1}$.

FIG. 3 is a graph showing an output characteristic of LSIT illustrated in FIGS. 1A and 1B, i.e. a relation between an amount of light incident upon the gate and the output voltage $V_{OUT}$ readout at the output terminal 5. In FIG. 3, when an amount of light l is zero, the LSIT is in an OFF state and the output voltage $V_{OUT}$ is equal to the drain voltage $V_D$. When the incident light becomes stronger, the LSIT becomes more conductive and the output voltage $V_{OUT}$ is decreased accordingly. When the incident light exceeds a saturation amount $l_1$, the output voltage becomes equal to a constant value $V_{OUT1}$. In a range from the zero to the saturation value $l_1$, it has been experimentally confirmed that the output voltage $V_{OUT}$ is in proportion to an amount of the incident light ($V_{OUT} \propto l$).

In the solid state image sensor comprising the above explained LSITs, LSITs each constituting respective pixels are arranged in matrix and are raster-scanned to derive an image signal. There have been proposed three scanning methods, i.e. drain-gate selection method, source-gate selection method and source-drain selection method.

FIG. 4 is a circuit diagram showing a solid state image sensor in which LSITs are arranged in matrix and are raster-scanned by the drain-gate selection method. In this embodiment, m×n LSITs 150-11, 150-12 . . . 150-21, 150-22 . . . 150-mn are arranged in m×n matrix and are successively readout by the XY address system. Each LSIT forming a pixel may comprise a gate region surrounding at least one of source and drain regions or situating between the source and drain regions. Source terminals of all LSITs are commonly connected to the ground potential and gate terminals of LSITs in each rows arranged in the X direction are connected to respective row lines 151-1, 151-2 . . . 151-m. Drain terminals of LSITs in each columns arranged in the Y direction are connected to respective column lines 152-1, 152-2 . . . 152-n which are commonly connected to video line 154 and ground line 154' via column selection transistors 153-1, 153-2 . . . 153-n and anti-selection transistors 153-1', 153-2' . . . 153-n', respectively. The video line 154 is connected to a video voltage source $V_{DD}$ through a load resistor 155. The row lines 151-1, 151-2 . . . 151-m are connected to a vertical scanning circuit 156 and receive vertical scanning signals $\phi_{G1}$, $\phi_{G2}$ . . . $\phi_{Gm}$, respectively. Gate terminals of the column selection transistors 153-1, 153-2 . . . 153-n and anti-selection transistors 153-1', 153-2' . . . 153-n' are connected to a horizontal scanning circuit 157 and receive horizontal scanning signals $\phi_{D1}, \phi_{D2} \ldots \phi_{Dn}$ and their inverted signals, respectively.

Now the operation of the solid state image sensor shown in FIG. 4 will be explained with reference to waveforms shown in FIGS. 5A to 5F showing vertical and horizontal scanning signals $\phi_G$ and $\phi_D$. Each of the signals $\phi_{G1}, \phi_{G2} \ldots$ applied to the row ines 151-1, 151-2 . . . assumes a readout gate voltage $V_{\phi G}$ having a small amplitude and a reset gate voltage $V_{\phi R}$ having a large amplitude. During a scanning period $t_H$ of one row, the signal $\phi_G$ assumes the value $V_{\phi G}$ and during a horizontal blanking period $t_{BL}$, it assumes the value $V_{\phi R}$. The horizontal scanning signals $\phi_{D1}, \phi_{D2} \ldots$ are used to select the column lines 152-1, 152-2 . . . and assume a low level by means of which the column selection transistors 153-1, 153-2 . . . 153-n are made conductive and the anti-selection transistors 153-1', 153-2' . . . 153-n' are made non-conductive.

Due to the operation of the vertical scanning circuit 156, when the signal $\phi_{G1}$ is changed to $V_{\phi G}$, an LSIT group 150-11, 150-12 . . . 150-1n is selected and when the horizontal selection transistors 153-1, 153-2 . . . 153-n are successively made conductive by the signals $\phi_{D1}, \phi_{D2} \ldots \phi_{Dn}$ supplied from the horizontal scanning circuit 157, the image signals are successively readout on the video line 154 from LSITs 150-11, 150-12 . . . 150-1n. These LSITs 150-11, 150-12 . . . 150-1n are simultaneously reset when the signal $\phi_{G1}$ is changed to the high level $V_{\phi R}$ to prepare for a next light signal accumulation. When the signal $\phi_{G2}$ is changed to the value $V_{\phi G}$, a next LSIT group 150-21, 150-22 . . . 150-2n connected to the row line 151-2 are selected and the image signals are successively readout from these LSITs 150-21, 150-22 . . . 150-2n by means of the horizontal scanning signals $\phi_{D1}, \phi_{D2} \ldots \phi_{Dn}$. Then these LSITs are simultaneously reset when the signal $\phi_{G2}$ is changed to $V_{\phi R}$. In the manner explained above, successive LSITs are readout to derive a video signal of one field.

In the solid state image sensor mentioned above, the drains of LSITs which are not selected are fixed to the ground potential by means of the anti-selection transistors, and thus photocarriers induced by the incident light are advantageously stored during the photocarrier storing period. However, this solid state image sensor has the following disadvantages.

Generally, the signal readout of the solid state image sensor as well as an image pick-up tube is processed in a signal processing circuit and is subjected to a $\gamma$-correction in which a white clip is effected at a level larger than a standard signal by about 1.1 times, said standard signal being equal to a tenth of a saturation level. Therefore, when considering a whole image pick-up system including the signal processing circuit a dynamic range of the output signal is substantially narrower than that of the solid state image sensor or image pick-up tube. This results in that when an object to be picked-up has a strong contrast, dark portions are uniformly made dark and bright portions are emphasized to a greater extent. In this manner, the solid state image sensor comprising LSITs has a drawback that it has a too large $\gamma$ value.

In the solid state image sensor mentioned above, LSIT has gate voltage $V_G$-drain current $I_D$ characteristic shown in FIG. 6. It is now assumed that under such an incident light condition that the output signal is just saturated when the signal readout is effected at the gate voltage $V_2$, the drain current $I_D$ becomes substantially zero at the gate voltage of $V_1$. When LSIT 150-11 is to be read out, the vertical scanning signal $\phi_{G1}$ becomes equal to $V_2$ and a signal current flows through LSIT 150-11 in accordance with the incident light condition. In LSITs 150-21, 150-31 . . . 150-m1, all the vertical scanning signals $\phi_{G2}, \phi_{G3} \ldots \phi_{Gm}$ are equal to $V_1$ and any currents do not flow through source-drain paths of these LSITs. In this manner only LSIT 150-11 is selected and read out. However, if LSIT 150-21 is under an excessive incident light condition, a drain current flows through this LSIT 150-21 even through the vertical scanning signal $\phi_{G2}$ is equal to $V_2$. Therefore, when LSIT 150-11 is to be read out, LSIT 150-21 connected to the same column line 150-1 as LSIT 150-11 is erroneously read out. In this manner when an amount of incident light is excessive, an erroneous signal is introduced from non-selected pixels and it is not possible to effect a normal image pick-up operation.

SUMMARY OF THE INVENTION

The present invention has for its object to provide a novel and useful solid state image sensor in which the $\gamma$-value can be made small by a simple construction to obtain a superior imaging property and an excellent image signal can be derived even if an amount of the incident light is excessive by avoiding a signal cross talk from non-selected pixels.

According to the invention, a solid state image sensor comprises a number of pixels arranged in matrix, each pixel being formed by a lateral type static induction transistor which includes source and drain regions formed in a surface of a semiconductor layer formed on an insulating or high resistance semiconductor substrate, and a gate region formed between the source and drain regions, a source-drain current flows in parallel with the surface of the semiconductor layer; and driving means for selectively supplying to said gate region a readout signal for reading an image signal in accordance with photocarriers stored in each pixel, a reset signal for discharging all the stored photocarriers, and a clear signal for discharging a part of the stored photocarriers after a reset operation, but prior to a next readout operation.

BRIEF EXPLANATION OF THE DRAWINGS

FIGS. 2A to 2D are signal waveforms for explaining the operation of the transistor shown in FIGS. 1A and 1B;

FIGS. 8A to 8F are signal waveforms for explaining the operation of the solid state image sensor shown in FIG. 7; and FIGS. 9A to 9E are schematic views showing a variation in potential and stored charge at pixels.

DESCRIPTION OF THE PREFERRED EMBODIMENTS

Figure 1A:
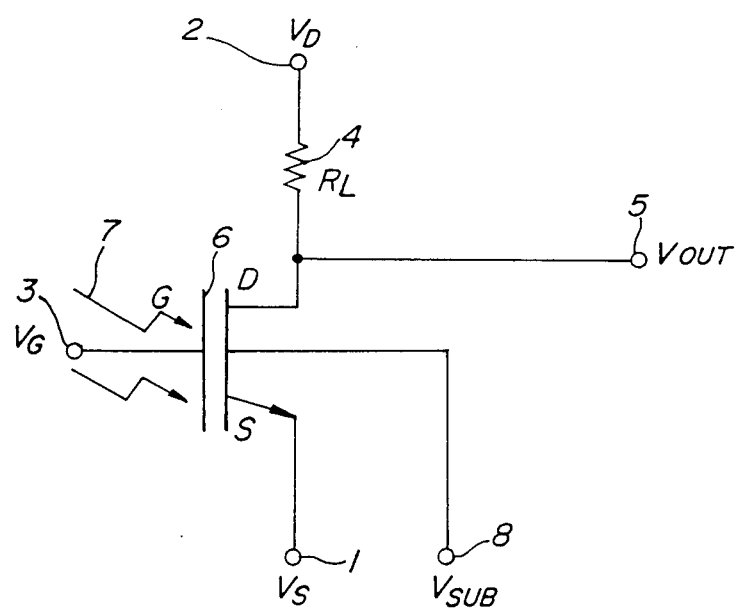
FIG. 1A is an equivalent circuit diagram of a lateral type static induction transistor.
Figure 1B:
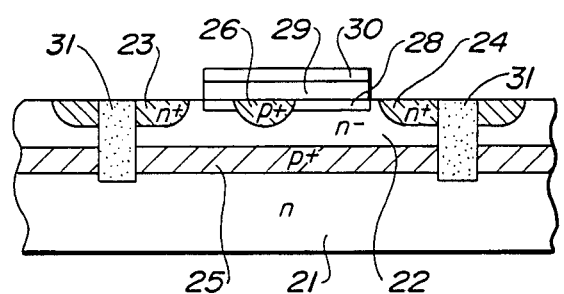
FIG. 1B is the structure of a lateral type static induction transistor.
Figure 3:
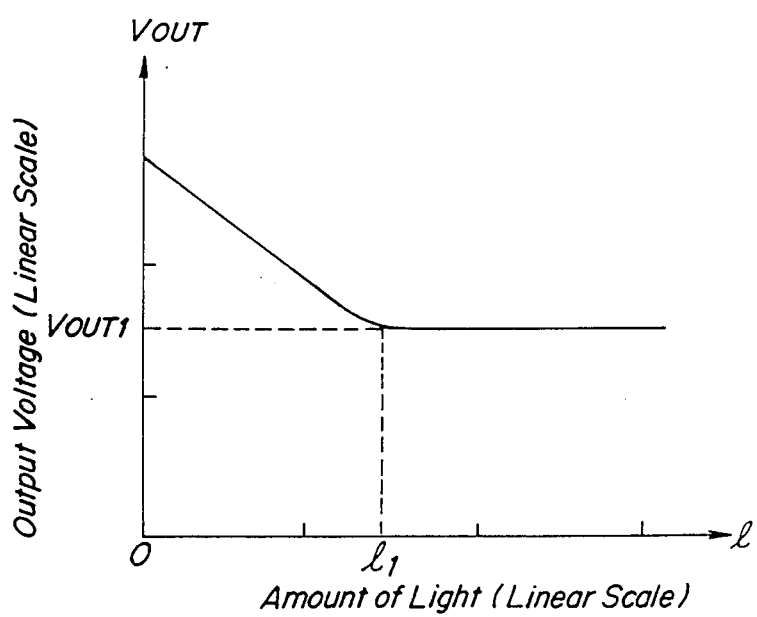
FIG. 3 is a graph showing a relation between an output voltage and an amount of incident light.
Figure 4:
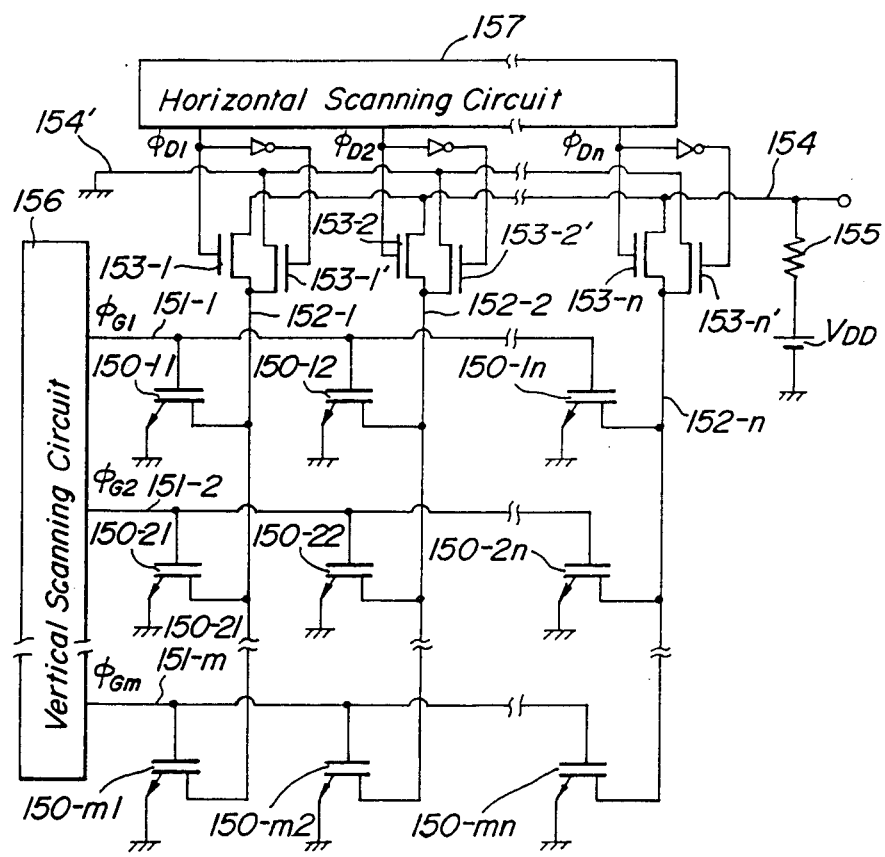
FIG. 4 is a circuit diagram showing a solid state image sensor comprising LSITs depicted in FIGS. 1A and 1B.
Figure 5:
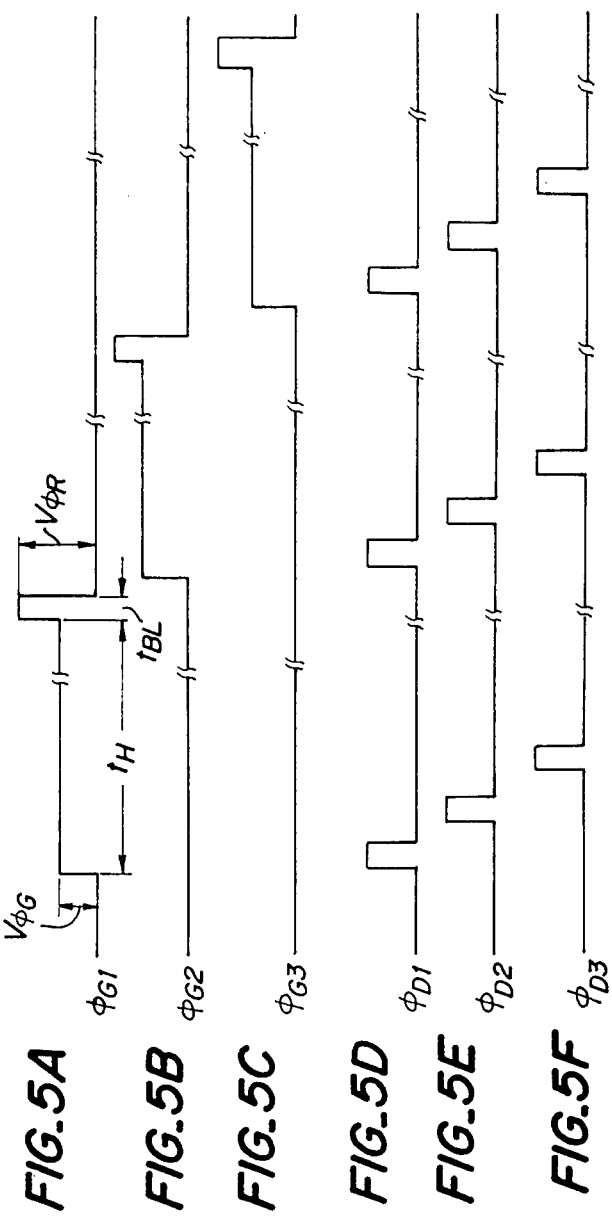
FIGS. 5A to 5F are signal waveforms for explaining the operation of the solid state image sensor shown in FIG. 4.
Figure 6:
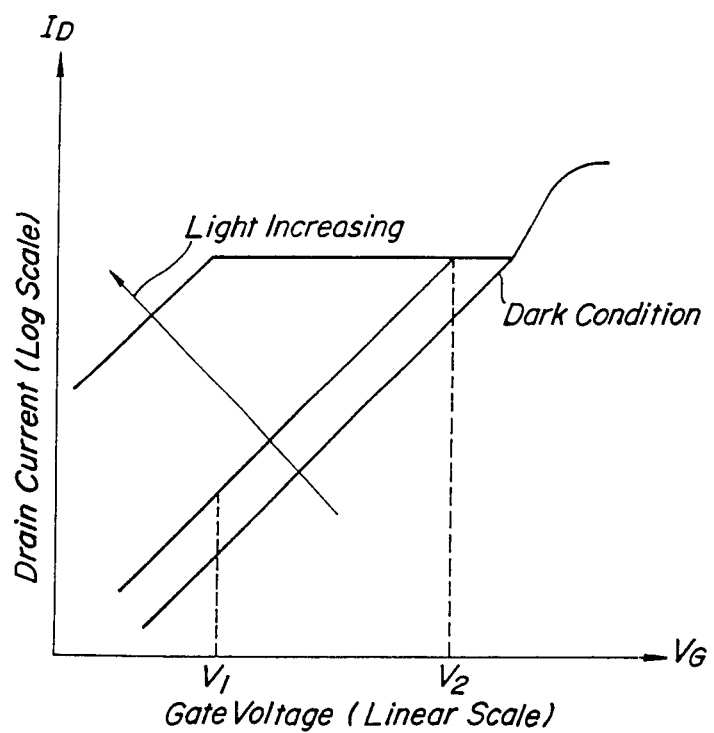
FIG. 6 is a graph illustrating a gate voltage-drain current characteristic of LSIT of FIGS. 1A and 1B.
Figure 7:
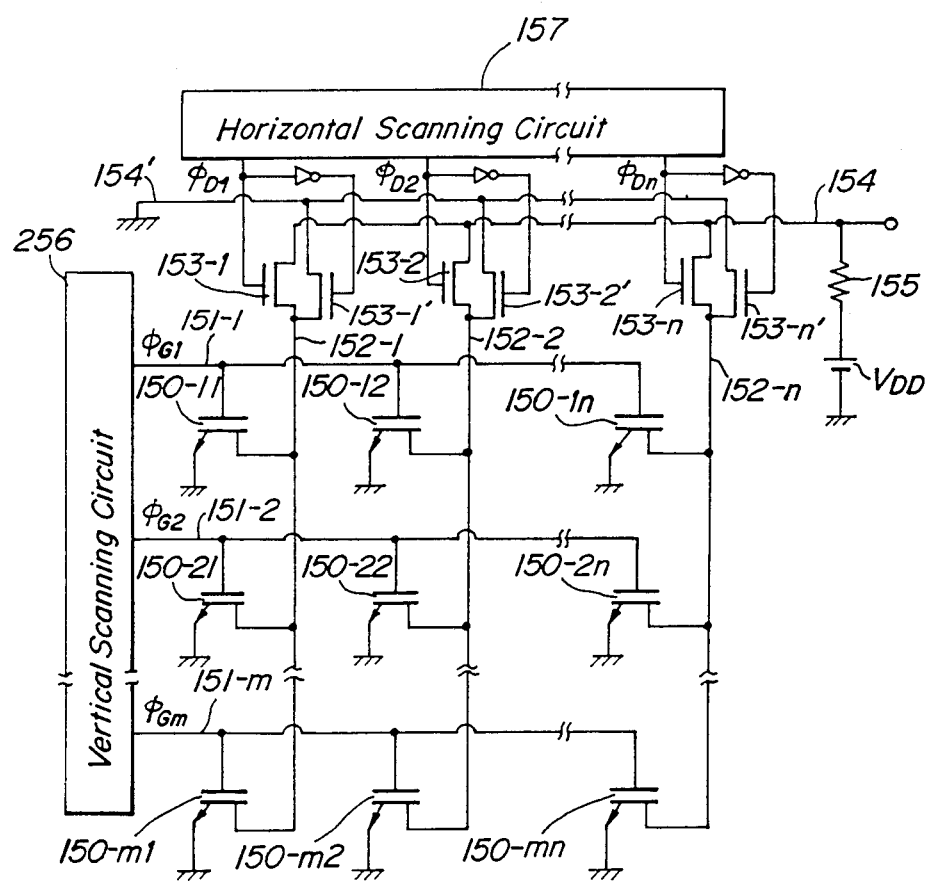
FIG. 7 is a circuit diagram showing an embodiment of the solid state image sensor according to the invention.

FIG. 7 is a circuit diagram showing an embodiment of the solid state image sensor according to the invention. The present embodiment differs from the solid state image sensor shown in FIG. 4 only in a point that a vertical scanning circuit 256 produces a vertical scanning signal $\phi_G$ illustrated in FIGS. 8A to 8F, and thus same or similar portions of this embodiment as those of the solid state image sensor shown in FIG. 4 are denoted by the same reference numerals used in FIG. 4.

FIGS. 8A to 8C illustrate horizontal scanning signals $\phi_{G1}$, $\phi_{G2}$, $\phi_{G3}$ and FIGS. 8D to 8F show vertical scanning signals $\phi_{D1}$, $\phi_{D2}$, $\phi_{D3}$. Each of the horizontal scanning signals comprises readout voltage $V_{\phi G}$, reset voltage $V_{\phi R}$ and clear voltage $V_{\phi C}$ which is a middle value between $V_{\phi G}$ and $V_{\phi R}$. The horizontal scanning signal $\phi_G$ assumes the readout voltage $V_{\phi G}$ during the scanning period $t_H$ of a relevant row, and then assumes the reset voltage $V_{\phi R}$ for the horizontal blanking period $t_{BL}$. According to the invention during blanking periods $t'_{BL}$ after the relevant horizontal scan, the voltage $\phi_G$ assumes the clear voltage $V_{\phi C}$.

In the present embodiment, after the relevant horizontal scan, the gate voltage $\phi_{G1}$ is changed to the clear voltage $V_{\phi C}$ in synchronism with all the blanking periods $t'_{BL}$ in other horizontal scans. However, it is not always necessary to change the gate voltage to the clear voltage $V_{\phi C}$ in every blanking periods, but it is also possible to set the gate voltage to the clear voltage $V_{\phi C}$ at one or more predetermined blanking periods.

The horizontal scanning signals $\phi_{D1}$, $\phi_{D2}$... serve to select the column lines 152-1, 152-2... and the column selection transistors 153-1, 153-2... are made off and anti-selection transistors 153-1', 153-2'... are made on by a lower level, and the column selection transistors are made conductive and the anti-selection transistors are made non-conductive by a higher level.

It is now assumed that LSIT 150-11 is under a normal exposure condition and a very large amount of light is made incident upon LSIT 150-12. FIGS. 9A to 9E show the variation in photocarriers stored in an inversion layer induced under the gate oxide film. In FIGS. 9A to 9E, columns [I] and [II] denote the variation in potential and stored charges at LSIT 150-11 and LSIT 150-12, respectively. At $t=0$, the charges in the inversion layer are reset and after that the integration of photocarriers is initiated. At $t=t_1$, the horizontal scanning is completed and the blanking period is started. By this time, given amounts of photocarriers have been stored in LSITs 150-11 and 150-12. When the gate voltage is increased to the clear voltage $V_{\phi C}$ at $t=t_2$ during the blanking period, an amount of photocarriers stored in LSIT 150-11 is not changed, but in LSIT 150-12 an excessive amount of photocarriers over a maximum amount of photocarriers which can be stored in the inversion layer at the clear voltage $V_{\phi C}$ flows away into the substrate. Next, at $t=t_3$, the photocarrier storing operation is initiated again to integrate photocarriers until $t=t_4$ just before the end of the horizontal scan. After that an excessive amount of photocarriers is discharged again in the same manner as that at $t=t_2$.

In the manner explained above, every time the vertical scanning signal $\phi_G$ is set to the clear voltage $V_{\phi C}$, any excessive amount of photocarriers is discharged and a part of the photocarriers stored in a pixel upon which a large amount of light is made incident flows into the substrate. Therefore, the $\gamma$-value at a larger amount of incident light can be made smaller and thus an excellent pick-up property can be attained.

Now the operation of the solid state image sensor shown in FIG. 7 will be explained under such a condition that LSIT 150-11 is in a normal exposure state and LSIT 150-21 receives very strong incident light. When the vertical scanning signal $\phi_{G1}$ is changed to the readout voltage $V_{\phi G}$ and the column selection transistor 153-1 is made conductive, a drain current of LSIT 150-11 flows through the column line 152-1 and load resistor 155. In LSIT 150-22, since an excessive amount of photocarriers has been dishcarged at the last blanking period, no drain current flows through LSIT 150-21 and therefore an excellent video signal without cross talk can be obtained.

The present invention is not limited to the embodiment explained above, but many modifications and alternations are possible within the scope of the invention. In the above embodiment, the drain, gate and source of the LSIT are connected to the row line, column line and common line, respectively and the signal readout is performed by the common source method, but it is also possible to effect the signal readout by the common source method in which the source, gate and drain of the LSIT are connected to column line, row line and common line, respectively. Further, the signal readout may be carried out by the source follower method in which the drain, gate and source of the LSIT are connected to column line, row line and common line, respectively. Moreover, the source follower signal readout may be also conducted by connecting the source, gate and drain of the LSIT to column line, row line and common line, respectively. In each of these embodiments, the $\gamma$-value can be made smaller at a larger amount of incident light by using the vertical scanning signals explained above and the signal cross talk from nonselected LSITs can be effectively avoided.

In the above embodiment, the reset operation is effected for respective rows, but it may be performed for each pixel. In such a case, a clear signal may be applied to a relevant pixel in synchronism with the reset operation at other pixels.

As explained above, according to the invention in the solid state image sensor comprising LSITs constituting pixels, since a part of the stored photocarriers is discharged after the reset operation, but prior to a next signal readout operation, it is possible to obtain a small $\gamma$-value and an excellent incident light-output characteristic, and further even if very strong light is partially made incident upon the image sensor, it is possible to derive an excellent image signal without cross talk.

What is claimed is:

1. A solid state image sensor comprising a number of pixels arranged in a matrix, each pixel being formed by a lateral type static induction transistor which includes source and drain regions formed in a surface of a semiconductor layer formed on an insulating or high resistance semiconductor substrate, and a gate region formed between the source and drain regions for controlling a source-drain current flowing in parallel with the surface of the semiconductor layer; and driving means for selectively supplying to said gate region a read out signal for reading an image signal in accordance with photocarriers stored in each pixel, a reset signal for discharging all the stored photocarriers, and a clear signal for discharging a part of the stored photocarriers after a reset operation, and prior to a next read out operation, said clear signal being set to such a value that the gate region is reverse biased to a lesser extent than by the reset signal.

2. A solid state image sensor according to claim 1, wherein said driving means is constructed such that said reset signal is generated during blanking periods of successing lines of said matrix after a read out operation for one line has been finished, but before a read out operation for a next line is initiated, and said clear signal being generated during at least one blanking period on lines of said matrix other than that on which said reset signal is generated.

3. A solid state image sensor according to claim 2, wherein said driving means comprises a plurality of row lines to each of which gates of lateral type static induction transistors arranged in respective rows are commonly connected, a plurality of column lines to each of which drains of lateral type static induction transistors arranged in respective columns are commonly connected, a vertical scanning circuit connected to said row lines and for applying said readout, reset and clear signals to said gates, a plurality of column selection transistors each connected between a video line and respective column lines, and a horizontal scanning circuit connected to gates of said column selection transistors.

4. A solid state image sensor according to claim 3, wherein said driving means further comprises a plurality of anti-selection transistors each connected between a ground line and respective column lines and having gates connected to said horizontal scanning circuit through inverters.

5. A solid state image sensor according to claim 2, wherein said clear signal is generated during each blanking period.

* * * * *